(12) United States Patent
Grant

(10) Patent No.: US 6,201,717 B1
(45) Date of Patent: *Mar. 13, 2001

(54) CHARGE-PUMP CLOSELY COUPLED TO SWITCHING CONVERTER

(75) Inventor: David Grant, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/389,691

(22) Filed: Sep. 4, 1999

(51) Int. Cl.[7] .................................................. H02M 3/18
(52) U.S. Cl. ................................ 363/60; 363/16; 363/131
(58) Field of Search .............................. 363/60, 16, 131; 323/282, 288

(56) References Cited

U.S. PATENT DOCUMENTS

| | | | |
|---|---|---|---|
| 4,803,612 | * | 2/1989 | Skovmand ............................ 323/284 |
| 5,627,460 | * | 5/1997 | Bazinet et al. ........................ 323/288 |
| 5,818,209 | * | 10/1998 | Masini et al. .......................... 323/289 |

* cited by examiner

Primary Examiner—Shawn Riley
(74) Attorney, Agent, or Firm—Pedro P. Hernandez; W. James Brady, III; Frederick J. Telecky, Jr.

(57) ABSTRACT

A circuit, (30, 54) comprising a plurality of switches ($S_1$, $S_2$, $S_3$, $S_4$ and $S_5$) coupled together in a charge pump arrangement (56). A first switch ($S_1$) is driven by a first driver ($X_1$), and a second switch ($S_2$) is driven by a second driver ($X_2$). The first and second switches ($S_1$ and $S_2$) are connected to the input voltage terminal ($V_{in}$). The charge pump arrangement (32, 56) is adapted to provide a bootstrap voltage ($V_{boot}$) and a drive voltage ($V_{drv}$) for a switch mode power supply. At least the first driver ($X_1$) is powered by a voltage higher than the input voltage ($V_{in}$). The higher voltage maybe obtained from a voltage ($V_3$) at a node between an additional switch ($S_6$) and an additional capacitor ($C_3$). Alternatively, the higher voltage may be obtained from the boot voltage ($V_{boot}$). Powering the driver ($X_1$) with the higher voltage allows the lateral semiconductor area of the charge pump circuit (32, 56) to be reduced, by using NMOS FETs for at least one switch. The invention is particularly useful for applications such as DSPs and mixed signal or analog circuits.

13 Claims, 3 Drawing Sheets

CHARGE-PUMP CLOSELY COUPLED TO SWITCHING CONVERTER

CROSS REFERENCE TO RELATED APPLICATIONS

Cross reference is made to the following patent applications, each assigned to the same assignee, the teachings of which are incorporated herein by reference:

| Patent No. | Serial No. | Filing Date | Inventor | Title |
|---|---|---|---|---|
| TBD | 09/389,811 | 09-04-99 | Grant | Integration of Synchronous Rectifier Restoration of Boot Capacitor into Charge-Pump |
| TBD | 09/389,810 | 09-04-99 | Martinez et al. | Controlled Linear Start-Up of a Linear Regulator |
| TBD | 09/389,809 | 09-04-99 | Grant et al. | Charge Pump Device and Method of Sequencing Charge Pump Switches |

TECHNICAL FIELD OF THE INVENTION

This invention relates generally to integrated circuits, and more specifically to a charge pump circuit for a switching converter.

BACKGROUND OF THE INVENTION

As logic integrated circuits (ICs) have migrated to lower working voltages in the search for lower power consumption and higher operating frequencies, and as overall system sizes have continued to decrease, IC power supply designs with smaller size and higher efficiency are in demand. Switch mode power supplies, or DC to DC converters, as they are sometimes called, are frequently used in IC circuits such as digital signal processors (DSPs) and mixed signal analog circuits, etc., to efficiently convert an input supply voltage to voltage levels appropriate for internal circuitry as well as external circuitry that the IC is coupled to. For instance, a 2.8 volt supply voltage provided to a BiCMOS IC may need to be increased internally to 5.0 volts to operate internal CMOS circuitry. As appliances and circuit designs continue to decrease in size, the need for smaller and more efficient IC switch mode power converters increases.

SUMMARY OF THE INVENTION

The present invention achieves technical advantages as a charge pump adapted for use in a circuit, the charge pump having switches driven by a voltage higher than an input voltage to the circuit, resulting in the ability to use smaller NMOS FETs as switches, saving semiconductor real estate.

In one embodiment, a circuit is adapted to receive an input voltage, including a means of producing a second voltage higher than the input voltage, the means being integral to the circuit. The circuit includes a plurality of switches coupled together in a charge pump arrangement, including a first switch, where at least the first switch is driven by the second voltage. The first switch may be driven by a first driver, and another of the switches may be a second switch driven by a second driver. The charge pump arrangement may be adapted to provide a bootstrap voltage at a bootstrap voltage terminal and a drive voltage for a switch mode power supply. The higher voltage may be obtained from a voltage at a node between an additional switch and an additional capacitor, or alternatively, the higher voltage may be obtained from the bootstrap voltage.

In another embodiment, a switch mode power converter powered by a charge pump circuit includes a first, second, third, fourth and fifth switch coupled together in a charge pump circuit. The first switch is connected to an input voltage terminal and is driven by a first driver. The second switch is connected to an input voltage terminal and is driven by a second driver. The charge pump arrangement provides a bootstrap voltage at a boot voltage terminal for a third driver and a drive voltage at a drive voltage terminal to a fourth driver. A first capacitor is coupled between the drive voltage terminal and a ground terminal. The first transistor is driven by the first driver and is coupled to the input voltage terminal and a phase node. The second capacitor is connected at one end to the bootstrap voltage terminal and at the other end to the phase node. A second transistor is coupled to the output of the second driver, the phase node and the ground terminal. At least the first driver is powered by a voltage higher than the input voltage at the input voltage terminal. The higher voltage may be obtained from a voltage at a node between an additional switch and an additional capacitor, or alternatively, the higher voltage may be obtained from the bootstrap voltage.

Also disclosed is a method of reducing the lateral semiconductor area of a charge pump circuit. The method includes the step of providing a plurality of switches coupled together in a charge pump arrangement, where the charge pump arrangement is adapted to provide a bootstrap voltage at a boot voltage terminal for a switch mode power supply. The plurality of switches includes at least a first switch and a second switch coupled to an input voltage terminal. The first and second switches are driven by a first driver and a second driver, respectively. The method includes the step of powering at least first driver with a voltage higher than input voltage. The higher voltage may be obtained from a voltage at a node between an additional switch and an additional capacitor, or alternatively, the higher voltage may be obtained from the bootstrap voltage.

Advantages of the present invention include at least one driver of a switch in the charge pump circuit being powered by a voltage higher than the input voltage of the circuit, which allows NMOS FETs to be used for the majority of the switches in the charge pump circuit, resulting in semiconductor real estate savings of one-half to on-third. Another advantage of the present invention is that noise generated by the charge pump is inherently synchronous to the main switching converter, which reduces the likelihood that charge pump noise will interfere with the main converter. A further advantage of the present invention is that the main load of the charge pump is the gate charge required for the main switching converter power FETs, synchronizing the charge pump to the main converter, making the charge pump output approximately track the demand. Also, the second embodiment of the present invention requires no additional components to achieve a bootstrap voltage higher than the input voltage powering the driver of the first switch.

BRIEF DESCRIPTION OF THE DRAWINGS

In the drawings, which form an integral part of the specification and are to be read in conjunction therewith.

Like numerals and symbols are employed in different figures to designate similar components in various views unless otherwise indicated.

DETAILED DESCRIPTION OF PREFERRED EMBODIMENTS

A problem with prior art switching converters with charge pumps is that the charge pump circuitry requires low resistance FETs in order to obtain a high efficiency. Some of the low resistance FETs must be PMOS, which require a large amount of area of silicon material, for example between 75,000 to 100,000 square microns. A charge pump circuit is needed in art having a high efficiency yet can utilize smaller FETs such as NMOS FETs which require one-half to two-thirds the area that PMOS FETs require, saving semiconductor real estate.

Figure 1:
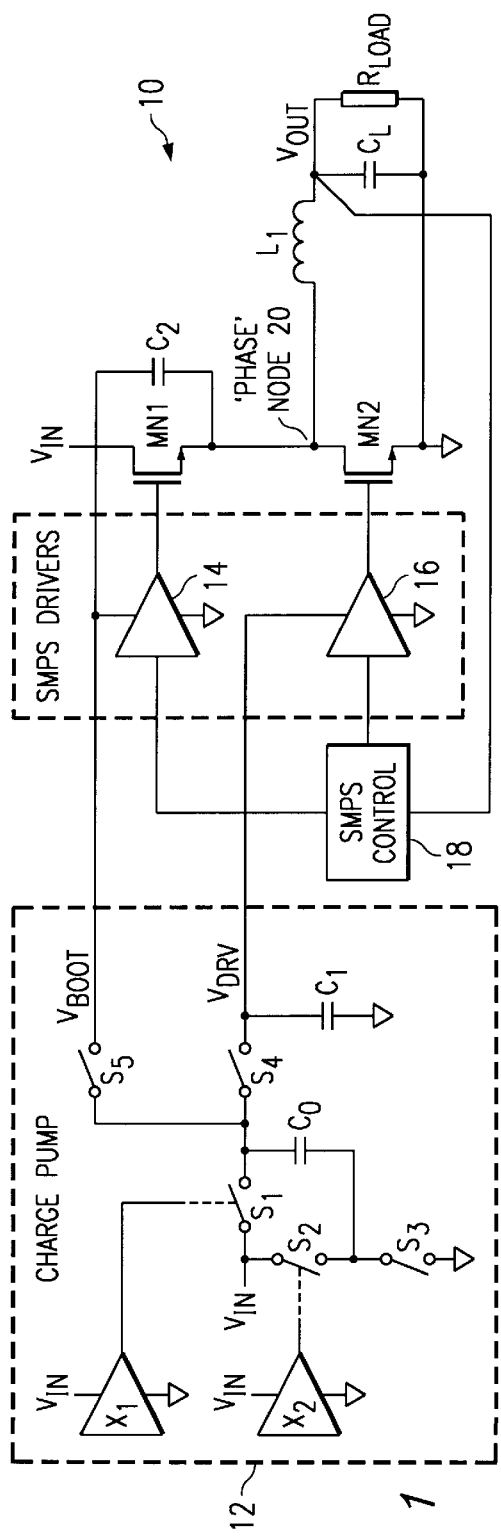
FIG. 1 is a block diagram of a switch mode converter powered from a charge pump.

FIG. 1 illustrates a block diagram of a switch mode converter 10 powered from a charge pump 12, of related case filed herewith, entitled "Circuit and Method of Restoring a Boot Capacitor of a Switch Mode Power Converter" by Grant. The charge pump 12 initially runs from an internal oscillator (not shown), until the capacitors $C_1$ and $C_2$ are fully charged. Once both capacitors $C_1$ and $C_2$ are charged, the main switch mode converter is started. The switch mode converter alternately turns transistors $MN_1$ and $MN_2$ on, causing the phase node 20 to swing between 0 V and $V_{in}$. The transistors $MN_1$ and $MN_2$ are often field effect transistors (FETs). The phase node 20 is tied to one end of capacitor $C_2$. The other end of capacitor $C_2$ provides the power supply for the driver 14 for transistor $MN_1$. When transistor $MN_1$ begins to turn on, the phase node 20 rises, increasing the drive voltage for transistor $MN_1$. The charge required to turn on transistor $MN_1$ is supplied from capacitor $C_2$. When the transistor $MN_1$ turns off and transistor $MN_1$ turns on, the phase node 20 is brought down to 0V and capacitor $C_2$ is recharged by switch $S_5$.

The charge pump 12 may include a first driver $X_1$ and a second driver $X_2$ that are used to drive switches $S_1$ and $S_2$, respectively. The drivers $X_1$ and $X_2$ are powered by input voltage Vin. The charge pump 12 is used to increase the supply voltage to a switching converter to allow the converter to drive external transistors, which may be inexpensive FETs with a high voltage threshold $V_t$. To achieve a charge pump 12 with a high efficiency, low resistance PMOS FETs are typically used in the art for the switches $S_1$, $S_2$, $S_4$, and $S_5$ of the charge pump 12, which may require up to approximately twice the amount of semiconductor real estate that NMOS FETs require. Switch $S_3$ is typically an NMOS FET.

Figure 2:
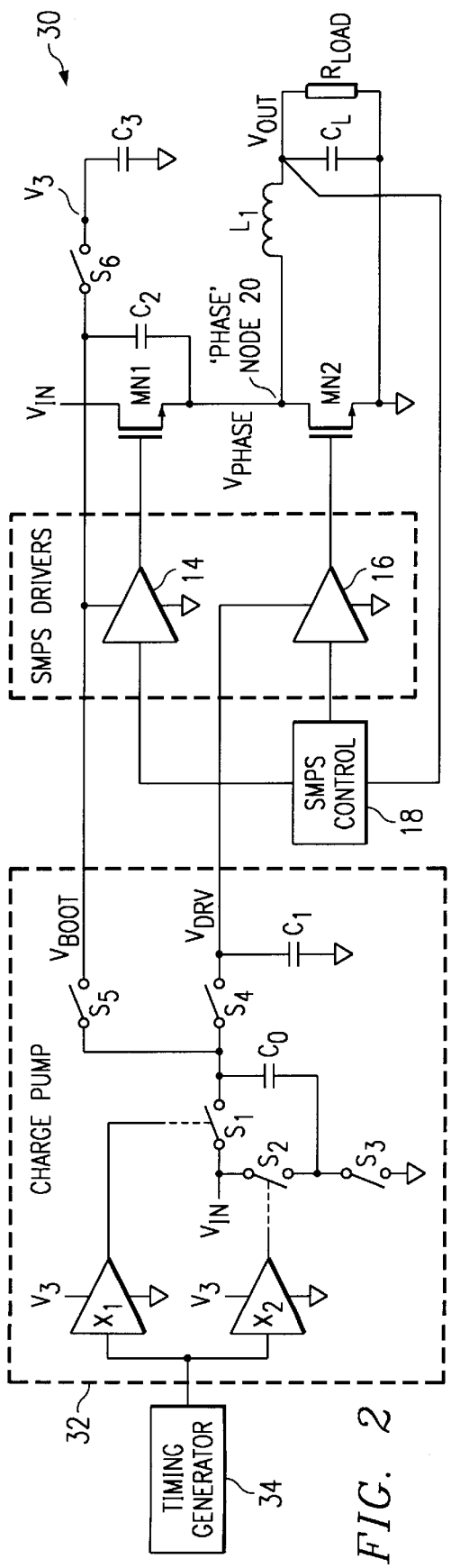
FIG. 2 illustrates a block diagram of a schematic of a first embodiment of the present invention with additional switch $S_6$ and capacitor $C_3$ creating a voltage $V_3$ that is used to power drivers $X_1$ and $X_2$.

FIG. 2 illustrates a block diagram of a first embodiment of the present invention, a circuit 30 including a charge pump 32 driving SMPS drivers 14 and 16. The charge pump comprises a first driver $X_1$ and a second driver $X_2$, the drivers obtaining a clock signal by timing generator 34.

Switches $S_1$ and $S_2$ are driven by the first driver $X_1$ and second driver $X_2$, respectively. A switch $S_3$ is coupled to capacitor $C_0$ and a ground terminal 22. Switch $S_4$ is coupled to $C_0$ and $S_1$, as well as switch $S_5$. The signal from switch $S_5$ is the voltage $V_{boot}$ which is used to power driver 14. The signal $V_{drv}$ at switch $S_4$ is used to power driver 16. Signal $V_{drv}$ is connected to capacitor $C_1$, which capacitor $C_1$ is connected to ground terminal 22. Drivers 14 and 16 are controlled by SMPS control 18. Driver 14 is controllably coupled to transistor $MN_1$, and driver 16 is controllably coupled to transistor $MN_2$. A capacitor $C_2$ is connected to the source of transistor $MN_1$ at one end and to the node containing signal $V_{boot}$ at the other end. The node at the source of transistor $MN_1$ defines a phase node 20 at which the signal $V_{phase}$ is located. The drain of transistor $MN_2$ is coupled to the phase node 20, and the source of transistor $MN_2$ is connected to ground terminal 22. An inductor $L_1$ is connected at one end to the phase node 20 and at the other end to an output terminal $V_{out}$. A load capacitor $C_L$ and a load $R_{load}$ comprising a processor, DSP, or logic IC, for example, are coupled across $V_{out}$ and the ground terminal 22. The circuit 30 provides an output voltage $V_{out}$ when an input voltage $V_{in}$ is applied to the circuit.

In the preferred embodiment of the circuit 30 shown in FIG. 2, an additional switch $S_6$ is connected at one end to the bootstrap capacitor $C_2$ and also to an additional capacitor $C_3$ which is connected to the ground terminal 22 at the other end. The voltage at a node $V_3$ between capacitors $C_3$ and switch $S_6$ is used to power the drivers $X_1$ and $X_2$ of the charge pump 32. When the end of capacitor $C_2$ connected to $V_{boot}$ is high, some of the charge from node $V_{boot}$ is transferred through switch $S_6$ to capacitor $C_3$. The voltage at node $V_3$ is approximately equal to ($V_{in}$ plus $V_{drv}$) and is used to power drivers $X_1$ and $X_2$ for switches $S_1$ and $S_2$, in the charge pump 32. Because $V_3$ is $V_{drv}$ higher than $V_{in}$, switches $S_1$ and $S_2$ are preferably NMOS devices, rather than being PMOS as in the prior art. This is advantageous because NMOS devices require the lowest amount of lateral semiconductor area for their required $Rds_{on}$. Using an NMOS FET may require 50,000 square microns versus the 75,000 to 100,000 square microns required by a PMOS FET. This results in a semiconductor real estate savings of 25,000 to 50,000 square microns, for each PMOS FET replaced by an NMOS FET. Switch $S_3$ is preferably NMOS and may be driven directly from $V_{drv}$. Depending on the minimum level of $V_{in}$, it may also be possible to make $S_4$ an NMOS FET driven off $V_3$ because the gate drive of $S_4$ will be $V_{in}$ above $V_{drv}$. However, if $V_{in}$ is too low to allow sufficient gate drive for switch $S_4$, a PMOS FET maybe used. Preferably, switches $S_1$, $S_2$, $S_3$ and $S_4$ are NMOS FETs to save the most amount of semiconductor real estate, although any one or several of them may also be PMOS, as the circuit design requires. Switch $S_5$ is preferably a PMOS device.

Preferably in order to reduce diode losses internal to FETs, switches $S_1$, $S_2$, $S_3$, $S_4$, $S_5$, and $S_6$ are MOS transistors. The sequencing of the MOS FETs is very closely tied to the switching of the main converter. At initial power up, the main converter is not running, and the charge pump 32 pumps $V_{drv}$ and $V_{boot}$ up to their target voltages. The phase node 20 is initially at 0 V. The target voltage of bootstrap voltage $V_{boot}$ is approximately equal to $V_{drv}$. Also at initial power up, the charge pump 32 does not have $V_3$ available yet, so the charge pump 32 runs at reduced efficiency. However, the main load on the charge pump 32, the main load being the main converter comprising SMPS drivers 14 and 16, is not running, so full efficiency is not yet required.

An auxiliary clock is preferably an external oscillator and is represented by the timing generator 34 generates the timing for the charge pump 32. Once voltages $V_{drv}$ and $V_{boot}$ are precharged sufficiently to start the main converter, the control of the timing of the charge pump 32 is handed over to the main converter and the main converter is then allowed to start. Once the main converter starts, the phase node 20 begins switching, so voltage $V_{boot}$ now switches between $V_{drv}$ and $(V_{drv}+V_{in})$, and $V_3$ equals approximately $(V_{drv}+V_{in})$. The charge pump 32 is able to run off a higher supply in accordance with the present invention, achieving full efficiency operation.

Figure 3:
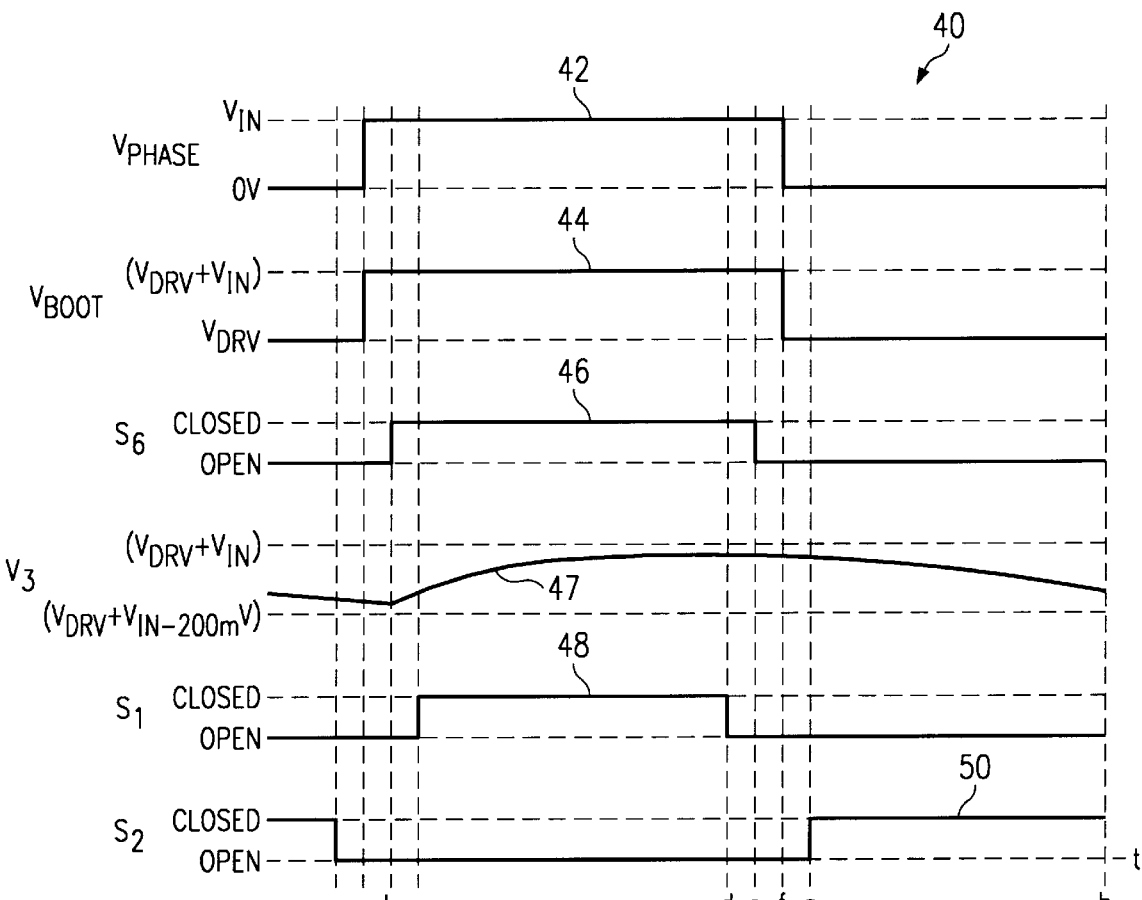
FIG. 3 is a timing diagram for the circuit shown in FIG. 2.

FIG. 3 shows a timing diagram for the circuit 30 of FIG. 2 once the system has been running for some time, with the x-axis representing time. At time "a," switch $S_6$ is open and $V_{phase}$ (signal 42) at the phase node 20 rises from 0 V to $V_{in}$. $V_{boot}$ (signal 44) is pushed up via the capacitor $C_2$ from approximately $V_{drv}$ to $(V_{drv}+V_{in})$. At time "b" switch $S_6$ closes (signal 46), allowing capacitor $C_3$ to charge from $V_{boot}$, shown at $V_3$ (signal 47). At time "c", the charge pump 32 reaches the point in its sequence when switch $S_1$ needs to be closed (signal 48). Because $V_{boot}$ is at approximately $(V_{drv}+V_{in})$, $V_{boot}$ can be used to drive an NMOS FET rather than a PMOS FET of the prior art to perform the switching function for switch $S_1$. In the first embodiment where $S_6$ and capacitor $C_3$ are present, the voltage $V_3$ on capacitor $C_3$ is used to power the drivers $X_1$ and/or $X_2$ that drive the gates of switches $S_1$ and $S_2$, respectively, which switches are preferably NMOS FETs.

At time "d", switch $S_1$ is opened (signal 48) before $V_{boot}$ falls again to $V_{drv}$. At time "e", switch $S_6$ is opened (signal 46) before $V_{boot}$ falls to $V_{drv}$. At time "f", $V_{phase}$ and $V_{boot}$ fall (signals 42 and 44, respectively). In the preferred embodiment, capacitor $C_3$ and switch $S_6$ are present so the voltage on $V_3$ (at signal 47) is held roughly equal to the peak voltage on $V_{boot}$ (signal 44), or $(V_{drv}+V_{in})$. At time "g" switch $S_2$ is closed (signal 50) and according to the preferred embodiment the voltage on $V_3$ (signal 47) is used to drive an NMOS FET for switch $S_2$. Voltage $V_3$ (signal 47) fluctuates from approximately $(V_{drv}+V_{in}-200$ mV$)$ to $(V_{drv}+V_{in})$. At time "h", $S_2$ is closed again (signal 50) and the cycle is ready to restart.

Figure 4:
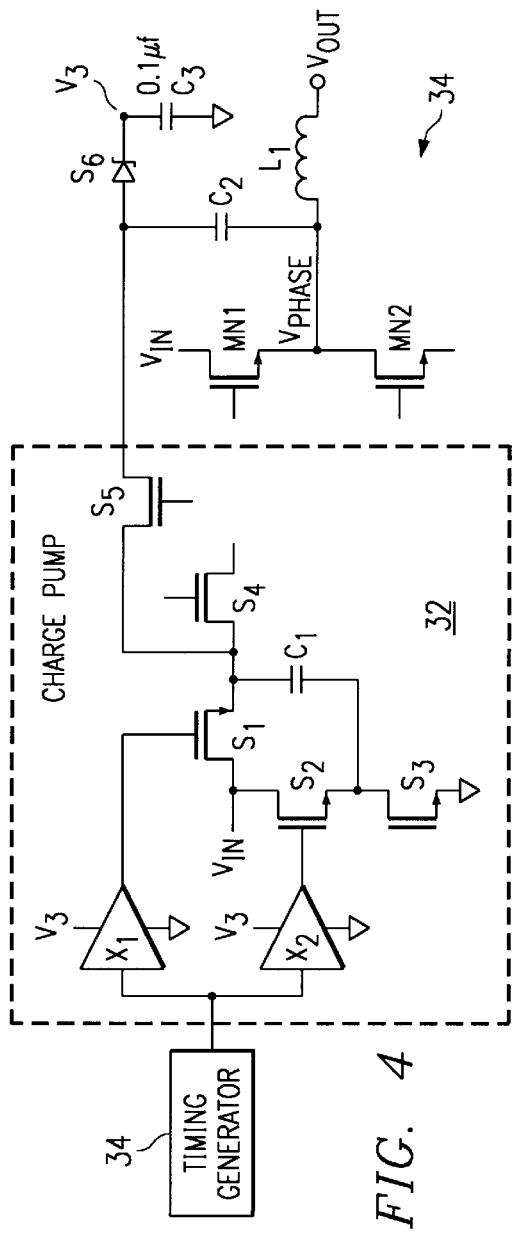
FIG. 4 is a more detailed view of portions of the circuit shown in FIG. 2, with switch $S_6$ implemented as a diode.

FIG. 4 illustrates in more detail portions of the circuit 30 shown in FIG. 2. The gates of switches $S_1$ and $S_2$, which preferably comprise NMOS FETs, are driven by drivers $X_1$ and $X_2$ respectively. Switch $S_3$ also preferably comprises an NMOS FET. A Schottky diode implemented for switch $S_6$, although a PMOS FET may also be used for switch S6, as shown in FIG. 2. Capacitor $C_3$ is preferably a capacitor of approximately 0.1 µF for example.

Figure 5:
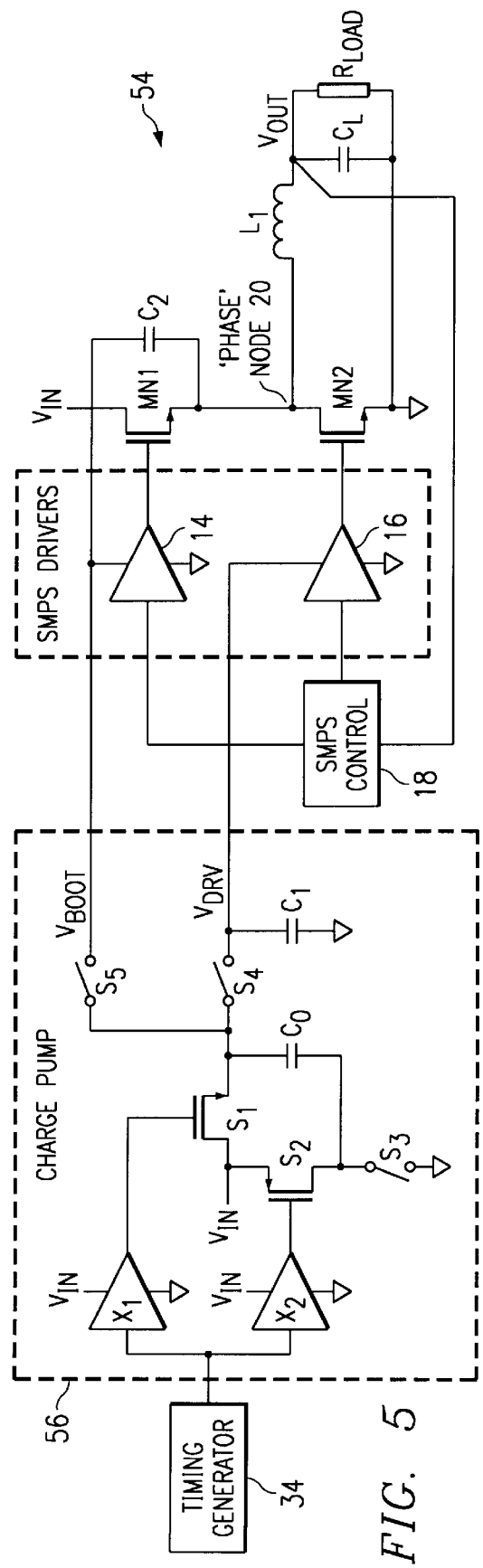
FIG. 5 illustrates a second embodiment of the present invention with drivers $X_1$ and $X_2$ being powered by the bootstrap voltage $V_{boot}$.

FIG. 5 shows a second embodiment of the present invention where driver $X_1$ is powered from $V_{boot}$ rather than $V_{in}$. This is advantageous because one less pin is required on the device, compared with the first embodiment, and an external capacitor $C_3$ is not required as in the first embodiment. However, switch $S_2$ does not derive benefit from an increased gate drive and is powered by Vin as in the prior art. In this configuration, $S_2$ cannot be powered by $V_{boot}$, because $V_{boot}$ is not in the high state when switch $S_2$ is required to be on. An additional advantage of the second embodiment is that an additional switch $S_6$ is not required, as in the first embodiment. However, the second embodiment is the less preferred implementation of the present invention because $V_3$ does not exist and switch $S_2$ must be implemented as a less efficient and real estate consuming PMOS FET device.

Figure 6:
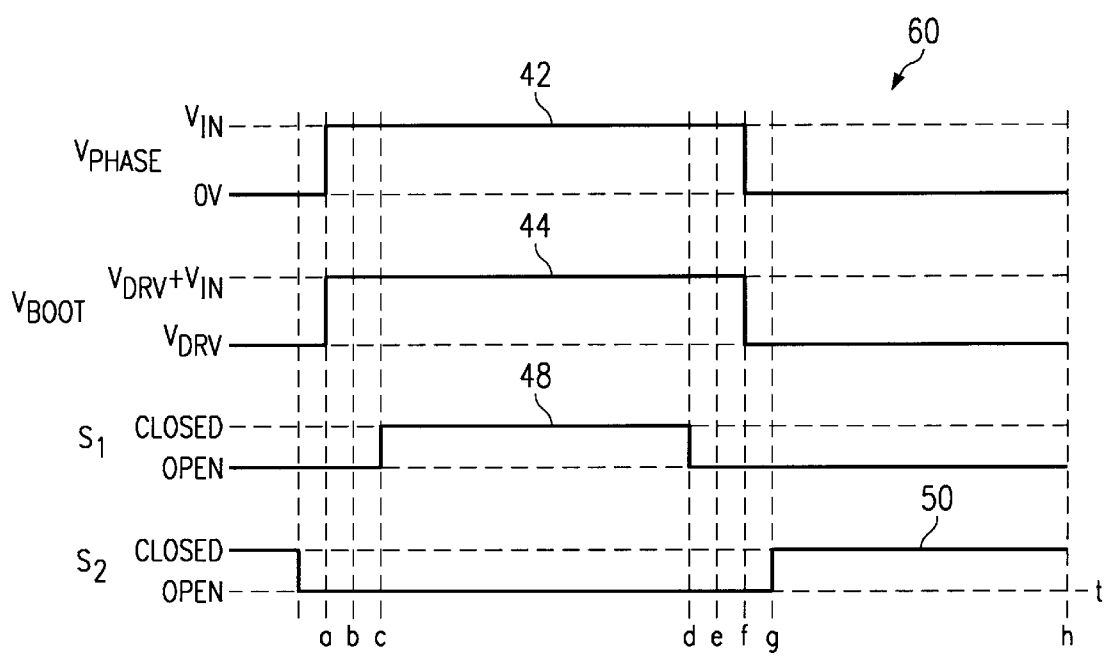
FIG. 6 is a timing diagram for the circuit shown in FIG. 5.

FIG. 6 shows a corresponding timing diagram 60 for the second embodiment. The timing of the second embodiment is similar to that of the first embodiment, without $S_6$ and $V_3$ shown. At time "a," $V_{phase}$ (signal 42) at the phase node 20 rises from 0V to $V_{in}$. $V_{boot}$ (signal 44) is pushed up via the capacitor $C_2$ from approximately $V_{drv}$ to $(V_{drv}+V_{in})$. At time "c", the charge pump 32 reaches the point in its sequence when switch $S_1$ needs to be closed (signal 48). Because $V_{boot}$ is at approximately $(V_{drv}+V_{in})$, $V_{boot}$ can be used to drive an NMOS FET rather than a PMOS FET of the prior art to perform the switching function for switch $S_1$. The voltage $V_{boot}$ on bootstrap capacitor $C_2$ is used to power the driver $X_1$ that drives the gate of switch $S_1$, which switch is preferably an NMOS FET. At time "d", switch $S_1$ is opened (signal 48) before $V_{boot}$ falls again to $V_{drv}$. At time "f", $V_{pase}$ and $V_{boot}$ fall (signals 42 and 44, respectively). At time "g" switch $S_2$ is closed (signal 50). At time "h" $S_2$ is closed again (signal 50) and the cycle is ready to restart.

One advantage of the present invention is that at least one driver of a switch in the charge pump circuit is powered by a voltage higher than the input voltage of the circuit. This allows NMOS FETs to be used for the majority of switches $S_1$, $S_2$, $S_3$, $S_4$ and $S_5$ in the charge pump circuit. Because NMOS FETs require less semiconductor area than the PMOS FETS used for switches in the prior art, the present invention saves semiconductor real estate.

Another advantage of the present invention is that noise generated by the charge pump is inherently synchronous to the main switching converter, which reduces the likelihood that charge pump noise will interfere with the main converter. This is particularly advantageous if the main converter is running fixed frequency to reduce interference, as it is often the case in sampled data system in communication systems, where the charge pump noise lies in the same frequency bands as the main converter noise.

Another advantage of the present invention is that the main load of the charge pump is the gate charge required for the main switching converter power FETs, which synchronizes the charge pump to the main converter, making the charge pump output approximately track the demand.

An advantage of the second embodiment of the present invention is that no additional components are required to achieve a voltage, Vboot, higher than voltage $V_{in}$ powering the driver $X_1$ of the first switch $S_1$. This allows the use of a semiconductor real estate saving PMOS FET for switch $S_1$.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, preferably four of the five switches within the charge pump are implemented as NMOS FET devices in the present invention. However, fewer than four switches may be implemented as NMOS devices, as is advantageous in each particular application. The charge pump circuit of the present invention may be utilized with a power converter in a wide variety of applications, such as digital signal processors, microprocessors, telecommunications applications, mobile devices and systems, laptops and personal computers, mixed signal and analog devices, and any lower power electrical application, in general.

What is claimed is:

1. A switch mode power converter powered by a charge pump circuit, comprising:
 a first, second, third, fourth and fifth switch coupled together in a charge pump circuit, said first switch connected to the input voltage terminal and driven by a first driver, said second switch connected to the input voltage terminal and driven by a second driver, said charge pump arrangement providing a bootstrap voltage at a bootstrap voltage terminal;

a first capacitor coupled between said drive voltage terminal and a ground terminal;

a first transistor driven by said first driver and coupled to said input voltage terminal and a phase node;

a second capacitor connected at one end to said bootstrap voltage terminal and at the other end to said phase node; and a second transistor coupled to the output of the second driver, said phase node and said ground terminal, wherein at least the first driver is powered by a voltage higher than the input voltage at said input voltage terminal.

2. The converter of claim 1 further comprising said second driver being powered by a voltage higher than the input voltage at said input voltage terminal.

3. The converter of claim 1 further comprising:

a sixth switch coupled to said bootstrap voltage terminal; and a third capacitor having a first end connected to said ground terminal and a second end coupled to said sixth switch, the voltage at the second end of said third capacitor powering at least said first driver driving said first switch of said charge pump arrangement.

4. The converter of claim 2, further comprising said voltage at the second end of said third capacitor powering said second driver driving said second switch.

5. The converter of claim 1 wherein said first driver driving said first switch is powered by said bootstrap voltage.

6. The converter of claim 1 wherein said converter comprises a semiconductor material and wherein at least said first and second switches of said charge pump arrangement comprise NMOS FETs, reducing the lateral physical area of said semiconductor material of said charge pump arrangement.

7. The converter of claim 1 wherein the voltage at the second end of said third capacitor is 2.5 volts or greater.

8. The converter of claim 1 wherein said charge pump arrangement comprises:

a third switch coupled to said second switch and said ground terminal;

a fourth switch coupled to said first switch and to said drive voltage terminal; and a fifth switch coupled to said first switch and said bootstrap voltage terminal.

9. A method of operating a switch mode power converter powered by a charge Dump circuit, comprising the steps of:

providing a plurality of switches coupled together in a charge pump arrangement and operating from an input voltage, said plurality of switches including at least a first switch and a second switch, said first and second switches being driven by a first driver and second driver, respectively;

generating a second voltage internal to said circuit, said second voltage being greater than said input voltage; and powering at least said first driver with said second voltage.

10. The method of claim 9 further comprising the step of:

powering said second driver with said second voltage.

11. The method of claim 9 further comprising the step of:

providing a third switch having a first and second end;

providing a capacitor at said second end of said third switch; and selectively switching said third switch to generate said second voltage at said first end of said third switch.

12. The method of claim 9 wherein at least said first switch is an NMOS FET.

13. The method of claim 9 further comprising the step of:

coupling said second voltage of said circuit to a switch mode power converter.

* * * * *